(12) United States Patent
Kang et al.

(10) Patent No.: US 12,456,603 B2
(45) Date of Patent: Oct. 28, 2025

(54) SUBSTRATE PROCESSING APPARATUS, SIGNAL SOURCE DEVICE, METHOD OF PROCESSING MATERIAL LAYER, AND METHOD OF FABRICATING SEMICONDUCTOR DEVICE

(71) Applicant: SAMSUNG ELECTRONICS CO., LTD., Suwon-si (KR)

(72) Inventors: Sung-gil Kang, Hwaseong-si (KR); Min-seop Park, Hwaseong-si (KR); Gon-jun Kim, Suwon-si (KR); Jae-jik Baek, Seongnam-si (KR); Jae-jin Shin, Seoul (KR); In-hye Jeong, Changnyeong-gun (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 510 days.

(21) Appl. No.: 18/089,691

(22) Filed: Dec. 28, 2022

(65) Prior Publication Data

US 2023/0147992 A1 May 11, 2023

Related U.S. Application Data

(62) Division of application No. 16/448,450, filed on Jun. 21, 2019, now Pat. No. 11,569,065.

(30) Foreign Application Priority Data

Jun. 21, 2018 (KR) .................. 10-2018-0071602

(51) Int. Cl.
*H01L 21/67* (2006.01)
*H01J 37/32* (2006.01)
(Continued)

(52) U.S. Cl.
CPC .. *H01J 37/32128* (2013.01); *H01J 37/32357* (2013.01); *H01L 21/02071* (2013.01);
(Continued)

(58) Field of Classification Search
None
See application file for complete search history.

(56) References Cited

U.S. PATENT DOCUMENTS 4,622,094 A 11/1986 Otsubo
6,129,806 A 10/2000 Kaji et al.
(Continued)

FOREIGN PATENT DOCUMENTS

CN 103123899 A 9/2015
CN 107068537 A 4/2022
(Continued)

*Primary Examiner* — Allan W. Olsen
(74) *Attorney, Agent, or Firm* — Muir Patent Law, PLLC

(57) ABSTRACT

A substrate processing apparatus includes a processing chamber; a susceptor provided in the processing chamber, wherein the susceptor is configured to support a substrate; a first plasma generator disposed on one side of the processing chamber; and a second plasma generator disposed on another side of the processing chamber, wherein the second plasma generator is configured to generate plasma by simultaneously supplying a sinusoidal wave signal and a non-sinusoidal wave signal to the susceptor. By using a substrate processing apparatus, a signal source device, and a method of processing a material layer according to the inventive concept, a smooth etched surface may be obtained for a crystalline material layer without a risk of device damage by RDC.

10 Claims, 17 Drawing Sheets

(51) Int. Cl.
*H01L 21/02* (2006.01)
*H01L 21/311* (2006.01)
*H01L 21/3213* (2006.01)

(52) U.S. Cl.
CPC .. *H01L 21/02595* (2013.01); *H01L 21/31122* (2013.01); *H01L 21/32136* (2013.01); *H01L 21/67028* (2013.01); *H01J 2237/3341* (2013.01)

(56) References Cited

U.S. PATENT DOCUMENTS

| | | | |
|---|---|---|---|
| 6,653,179 B1* | 11/2003 | Minegishi | H01L 21/02532 257/E21.414 |
| 8,286,581 B2 | 10/2012 | Hayami et al. | |
| 9,460,894 B2 | 10/2016 | Lill et al. | |
| 9,564,295 B2 | 2/2017 | Lee et al. | |
| 9,685,297 B2 | 6/2017 | Carter et al. | |
| 9,991,128 B2* | 6/2018 | Tan | H01L 21/3065 |
| 10,431,685 B2 | 10/2019 | Lee et al. | |
| 2007/0108529 A1* | 5/2007 | Huang | H10D 84/0177 257/E21.633 |
| 2008/0178805 A1 | 7/2008 | Paterson et al. | |
| 2009/0078678 A1 | 3/2009 | Kojima et al. | |
| 2009/0153826 A1* | 6/2009 | Sewell | G03F 7/70466 355/77 |
| 2009/0227084 A1* | 9/2009 | Wu | H10D 30/0227 438/301 |
| 2010/0006226 A1 | 1/2010 | Cho et al. | |
| 2010/0019324 A1* | 1/2010 | Ohara | H10D 84/0177 438/303 |
| 2010/0072172 A1 | 3/2010 | Ui et al. | |
| 2010/0154994 A1 | 6/2010 | Fischer et al. | |
| 2010/0296338 A1* | 11/2010 | Park | H10B 63/30 365/163 |
| 2012/0052599 A1 | 3/2012 | Brouk et al. | |
| 2012/0247677 A1 | 10/2012 | Himori et al. | |
| 2012/0319584 A1 | 12/2012 | Brouk et al. | |
| 2014/0099794 A1 | 4/2014 | Ingle et al. | |
| 2015/0170924 A1 | 6/2015 | Nguyen et al. | |
| 2017/0358431 A1 | 12/2017 | Dorf et al. | |
| 2018/0032100 A1 | 2/2018 | Kim et al. | |
| 2023/0163163 A1* | 5/2023 | Chen | H10D 1/692 257/532 |

FOREIGN PATENT DOCUMENTS

| | | |
|---|---|---|
| JP | H10270419 A | 10/1998 |
| JP | 2008263226 A | 10/2008 |
| JP | 2015532016 A | 11/2015 |
| KR | 10-2010-0034703 A | 4/2010 |
| KR | 10-2017-0088114 A | 8/2017 |
| KR | 10-2017-0093718 A | 8/2017 |
| KR | 1020190011133 A | 2/2019 |
| TW | 200845387 | 11/2008 |

* cited by examiner

SUBSTRATE PROCESSING APPARATUS, SIGNAL SOURCE DEVICE, METHOD OF PROCESSING MATERIAL LAYER, AND METHOD OF FABRICATING SEMICONDUCTOR DEVICE

CROSS-REFERENCE TO RELATED APPLICATION

This application is a divisional of and claims priority to U.S. patent application Ser. No. 16/448,450 filed on Jun. 21, 2019, which claims the benefit of Korean Patent Application No. 10-2018-0071602, filed on Jun. 21, 2018, in the Korean Intellectual Property Office, the disclosures of which are hereby incorporated by reference in their entirety .

BACKGROUND

The inventive concept relates to a substrate processing apparatus, a signal source device, a method of processing a material layer, and a method of fabricating a semiconductor device, and more particularly, to a substrate processing apparatus capable of performing radical dry cleaning (RDC) on a crystalline material layer, a signal source device, a method of processing a material layer, and a method of fabricating a semiconductor device.

RDC is a process widely used from among processes for processing a semiconductor substrate on which devices are formed. RDC is a dry process and is capable of removing a material isotropically, thus being utilized in various ways. Furthermore, a certain degree of anisotropy may be obtained by applying a slight bias, and thus applicability of RDC is very high. On the other hand, when a crystalline material layer is etched by RDC, a highly rough etching surface may be obtained.

SUMMARY

The inventive concept provides a substrate processing apparatus capable of obtaining a smooth etched surface without a risk of damaging devices through RDC even for a crystalline material layer.

The inventive concept also provides a signal source device for a composite RDC that may be used in the substrate processing apparatus.

The inventive concept also provides a method of processing a material layer, the method by which a smooth etched surface may be obtained without a risk of damaging devices through RDC even for a crystalline material layer.

The inventive concept also provides a method of fabricating a semiconductor device by using the method of processing a material layer, wherein the semiconductor device has stable electrical characteristics.

According to an aspect of the inventive concept, provided is a substrate processing apparatus including: a processing chamber; a susceptor disposed in the processing chamber, wherein the susceptor is configured to support a substrate; a first plasma generator, disposed on one side of the processing chamber; and a second plasma generator disposed on another side of the processing chamber, wherein the second plasma generator is configured to generate plasma by simultaneously supplying a sinusoidal wave signal and a non-sinusoidal wave signal to the susceptor.

According to another aspect of the inventive concept, provided is a substrate processing apparatus including: processing chamber; a susceptor disposed in the processing chamber, wherein the susceptor is configured to support a substrate; an inlet configured to introduce remotely generated plasma into the processing chamber; and a plasma generator configured to generate a plasma by simultaneously supplying a sinusoidal wave signal and a non-sinusoidal wave signal to the susceptor, wherein the plasma generator includes: a sinusoidal wave generator configured to generate a sinusoidal wave signal to supply a sinusoidal wave signal to the susceptor; a non-sinusoidal wave generator configured to generate a non-sinusoidal wave signal to supply a non-sinusoidal wave signal to the susceptor; a first filter configured to prevent the non-sinusoidal wave signal from interfering with the sinusoidal wave generator; a second filter configured to prevent the sinusoidal wave signal from interfering with the non-sinusoidal wave generator; and a mixer configured to mix a sinusoidal wave signal and a non-sinusoidal wave signal respectively supplied from the sinusoidal wave generator and the non-sinusoidal wave generator.

According to another aspect of the inventive concept, provided is a signal source apparatus for composite radical dry cleaning (RDC), the apparatus including: a sinusoidal wave generator configured to supply a sinusoidal wave signal; a non-sinusoidal wave generator configured to supply a non-sinusoidal wave signal; a mixer configured to receive the sinusoidal wave signal and the non-sinusoidal wave signal from the sinusoidal wave generator and the non-sinusoidal wave generator, respectively; a first filter configured to prevent the sinusoidal wave signal from interfering with the non-sinusoidal wave generator; and a second filter configured to prevent the non-sinusoidal wave signal from interfering with the sinusoidal wave generator.

According to another aspect of the inventive concept, provided is a method of processing a material layer, the method including: positioning a substrate including a polycrystalline material layer on a susceptor in a processing chamber; converting an upper portion of the polycrystalline material layer into an amorphous material layer; and removing the amorphous material layer by using a radical, wherein the converting of the upper portion of the polycrystalline material layer into the amorphous material layer includes: supplying a sinusoidal wave signal and a non-sinusoidal wave signal to the susceptor to provide radicals and ions to the upper portion of the polycrystalline material layer.

According to another aspect of the inventive concept, provided is a method of fabricating a semiconductor device, the method including: forming a plurality of active regions on a substrate extending in a first direction and a device isolation film defining the active regions; forming a dummy gate line extending in a second direction intersecting the active regions on the device isolation film; forming source-drain regions in portions of the active regions exposed on both sides of the dummy gate line; forming an insulating film covering the device isolation film and the source-drain regions around the dummy gate line; removing the dummy gate line to form a gate trench extending between the source-drain regions; forming a gate insulating film and a polycrystalline gate material layer in the gate trench; converting an upper portion of the gate material layer into an amorphous material layer; and removing the amorphous material layer by using radicals.

BRIEF DESCRIPTION OF THE DRAWINGS

Embodiments of the inventive concept will be more clearly understood from the following detailed description taken in conjunction with the accompanying drawings in which:

FIGS. 9A to 9C are diagrams showing a semiconductor device provided on a semiconductor substrate, wherein FIG. 9A is a plan view of the semiconductor device, FIG. 9B is a perspective view of the semiconductor device, and FIG. 9C is a cross-sectional view of the semiconductor device.

DETAILED DESCRIPTION OF THE EMBODIMENTS

Figure 1A:
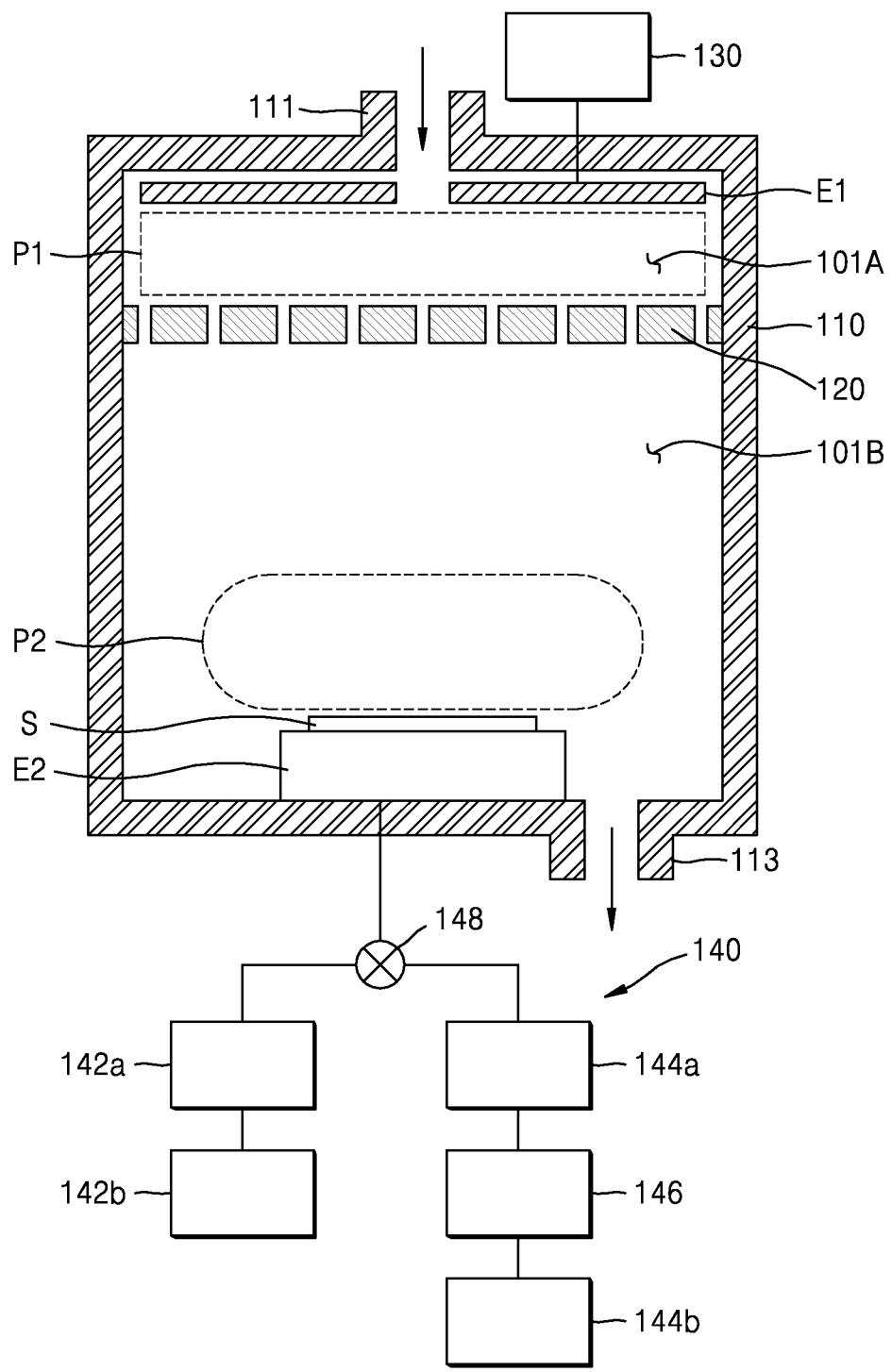
FIGS. 1A and 1B are schematic block diagrams showing substrate processing apparatuses according to example embodiments.

FIG. 1 is a block diagram schematically showing a substrate processing apparatus 100 according to an example embodiment.

Referring to FIG. 1, the substrate processing apparatus 100 includes a processing chamber 110, a first electrode E1 and a second electrode E2 in the processing chamber 110, a first plasma generator 130 configured to supply a high frequency signal to the first electrode E1, and a second plasma generator 140 configured to supply a signal to the second electrode E2.

In some embodiments, the substrate processing apparatus 100 may be a substrate processing apparatus for radical dry cleaning (RDC).

The processing chamber 110 may have, for example, a cylindrical shape, and may have a first space 101A and a second space 101B therein. The interior space of the processing chamber 110 may be defined into the first space 101A and the second space 101B by a shower head 120. The inner wall of the processing chamber 110 may include a material like quartz, yttria ($Y_2O_3$), etc.

An inlet 111 through which a process gas is introduced may be provided at the upper portion of the processing chamber 110. The process gas may flow through the inlet 111 into the first space 101A of the processing chamber 110.

Plasma generated by the first plasma generator 130 may flow toward the shower head 120 in the first space 101A. Although FIG. 1 shows a direct generation mechanism in which plasma is directly generated by the first plasma generator 130 in the first space 101A, plasma generated by a remote source may flow into the first space 101A.

The first plasma generator 130 may include a high frequency power source and a matcher. The matcher may reduce reflection of high-frequency power from the first electrode E1, thereby maximizing the efficiency of supplying the high-frequency power to the first electrode E1.

The first plasma generator 130 may generate first plasma P1 in the first space 101A by supplying a high frequency signal from about 2 MHz to about 40 MHz (e.g., 13.56 MHz) to the first electrode E1. The first plasma P1 may include both radicals and ions.

The first plasma P1 may be relatively uniformly distributed and flow into the second space 101B through the shower head 120. The shower head 120 may be grounded. In this case, the shower head 120 may allow radicals of the first plasma P1 to pass, but may block ions of the first plasma P1.

As a result, the second space 101B may include primarily or only radicals. In some embodiments, an increased ratio of radicals may be present in the second space 101B as compared to the first space 101A.

The second plasma generator 140 may include a sinusoidal wave generator 142b capable of generating a sinusoidal wave signal and a non-sinusoidal wave generator 144b capable of generating a non-sinusoidal wave signal. Here, the sinusoidal wave signal may refer to any periodic signal that may be expressed as a sine and/or cosine function. In addition, the non-sinusoidal wave signal may refer to any signal periodically repeated with a certain waveform other than that of a sinusoidal wave.

The sinusoidal wave signal and the non-sinusoidal wave signal may be mixed by a mixer 148 and supplied to the second electrode E2. In some embodiments, a first filter 142a may be provided to prevent the non-sinusoidal wave signal from interfering with the sinusoidal wave generator 142b. In some embodiments, a second filter 144a may be provided to prevent the sinusoidal wave signal from interfering with the non-sinusoidal wave generator 144b. Although FIG. 1 shows that the first filter 142a and the second filter 144a are separate from each other, the first filter 142a and the second filter 144a may be integrated as a single body.

The second electrode E2 may be a susceptor on which a substrate S is disposed. In some embodiments, the second electrode E2 may be provided separately from a susceptor in which the substrate S is disposed. The substrate S may be, but is not limited to, a semiconductor substrate like a silicon wafer and a glass substrate.

Inside the susceptor, for example, a cooling unit and a heating unit having annular shapes extending in the circumferential direction may be provided.

Second plasma P2 may be generated above the second electrode E2 by a non-sinusoidal wave signal and a sinusoidal wave signal supplied through the mixer 148.

The second plasma P2 may have an ion energy distribution for modifying a certain material layer exposed on a surface of the substrate S.

Figure 2A:
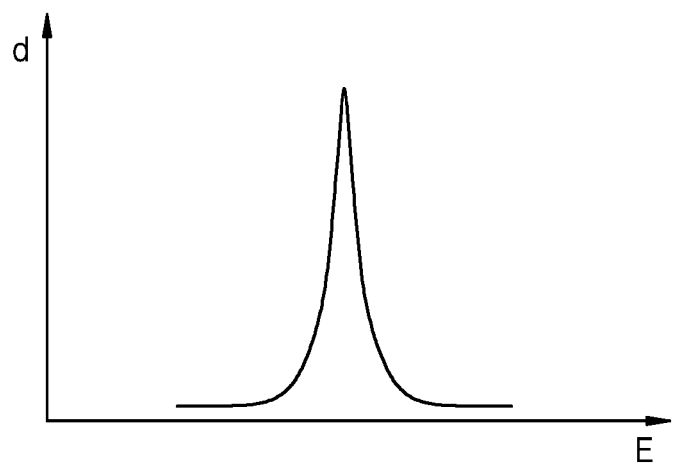
FIG. 2A is a graph schematically showing an ion energy distribution in second plasma according to an example embodiment.

FIG. 2A is a graph schematically showing an ion energy distribution in the second plasma P2 according to an example embodiment.

Referring to FIG. 2A, the ion energy distribution of ions in the second plasma P2 may have a distribution having a single peak shape. The peak may have a relatively narrow and sharp distribution. The ion energy distribution having a single peak shape is obtained by supplying a combination of a sinusoidal wave signal and a non-sinusoidal wave signal to the second electrode E2.

Figure 2B:
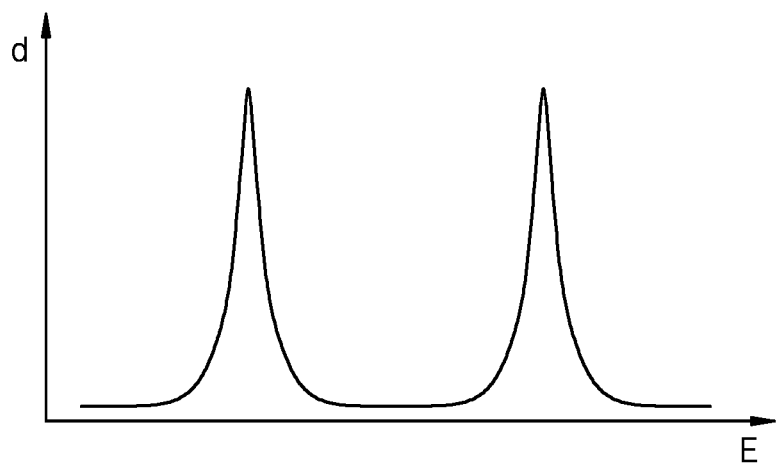
FIG. 2B is a graph schematically showing an ion energy distribution of ions in plasma generated when only a sinusoidal wave is supplied to a substrate.

FIG. 2B is a graph schematically showing an ion energy distribution of ions in plasma generated when only a sinusoidal wave is supplied to the substrate S.

Referring to FIG. 2B, the ion energy distribution of ions in the plasma has a bipeak-type distribution in which two peaks exist. When a material layer is processed using ions corresponding to one of these two peaks, a material layer, a device, and a structure on the substrate may be damaged by ions corresponding to the other peak.

On the other hand, as shown in FIG. 2A, when the ion energy distribution has a single peak shape, an optimal energy distribution for a desired processing of a material layer may be obtained, and thus the possibility of damaging a material layer, a device, and a structure as in the case of a bipeak-type distribution may be significantly reduced.

As described above, the ion energy distribution having a single peak shape as shown in FIG. 2A may be obtained based on a combination of a sinusoidal wave signal and a non-sinusoidal wave signal. In detail, the ion energy distribution having a single peak shape may be obtained by combining a sinusoidal wave signal with a particular non-sinusoidal wave signal.

Figure 3:
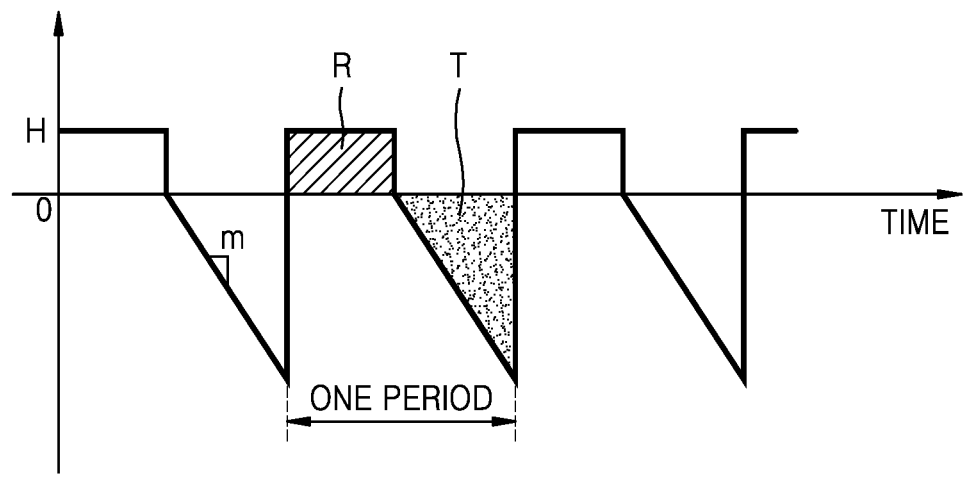
FIG. 3 is a timing diagram showing a non-sinusoidal wave signal according to an example embodiment.

FIG. 3 is a timing diagram showing the non-sinusoidal wave signal according to an example embodiment.

Referring to FIG. 3, a non-sinusoidal wave of one period may have a shape in which a rectangular waveform R and a sawtooth waveform T are combined. However, the inventive concept is not limited thereto, and the non-sinusoidal wave may have a different shape. The shape of the non-sinusoidal wave may be determined to obtain a desired ion energy distribution by being combined with a sinusoidal wave having a certain frequency. In some embodiments, the shape of the non-sinusoidal wave may be determined through trials and errors to obtain a desired ion energy distribution by being combined with a sinusoidal wave having a certain frequency.

In some embodiments, the magnitude and the location of a peak (i.e., a single peak) in the ion energy distribution may be related, for example, to particular parameters of the non-sinusoidal wave, and, by changing the parameters, the magnitude and the location of the single peak may be adjusted. For example, the parameters of the non-sinusoidal wave for adjusting the magnitude and the location of the single peak may include a height H of the rectangular waveform R and a slope m of the hypotenuse of the sawtooth waveform T. However, the parameters of the non-sinusoidal wave for adjusting the magnitude and the location of the single peak are not limited thereto, and other parameters therefor may exist. One of ordinary skilled in the art will understand that the other parameters also fall within the scope of the inventive concept.

Referring to FIGS. 1 and 3 together, the second plasma generator 140 may further include a non-sinusoidal wave controller 146 capable of controlling the height H of the rectangular waveform R of the non-sinusoidal wave and the slope m of the hypotenuse of the sawtooth waveform T of the non-sinusoidal wave.

Figure 4:
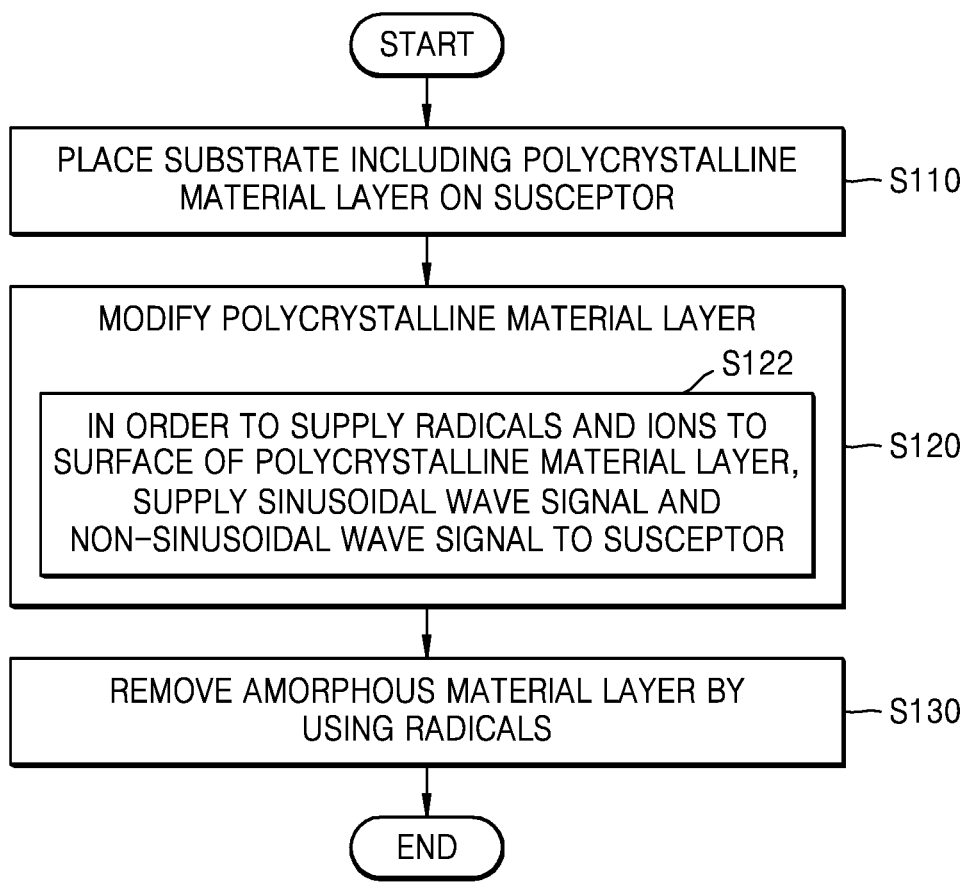
FIG. 4 is a flowchart of a method of processing a crystalline material layer, according to an example embodiment.
Figure 5A:
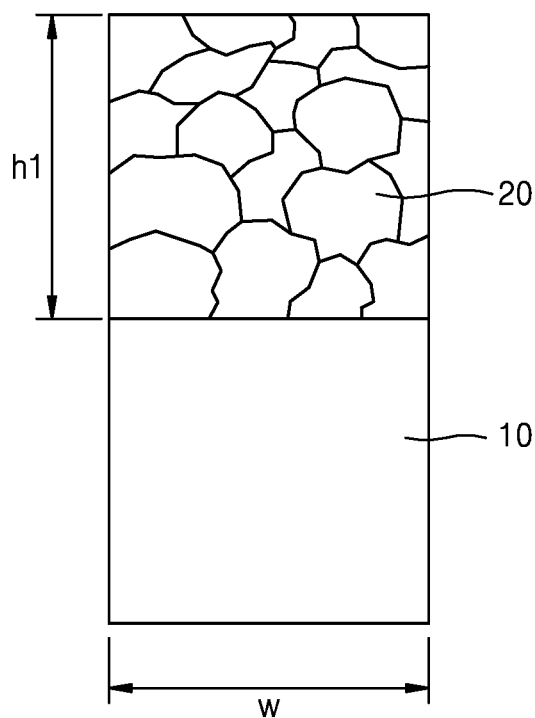
FIGS. 5A to 5C are schematic diagrams showing changes in a crystalline material layer when the crystalline material layer is treated with a single peak, according to an example embodiment.
Figure 5B:
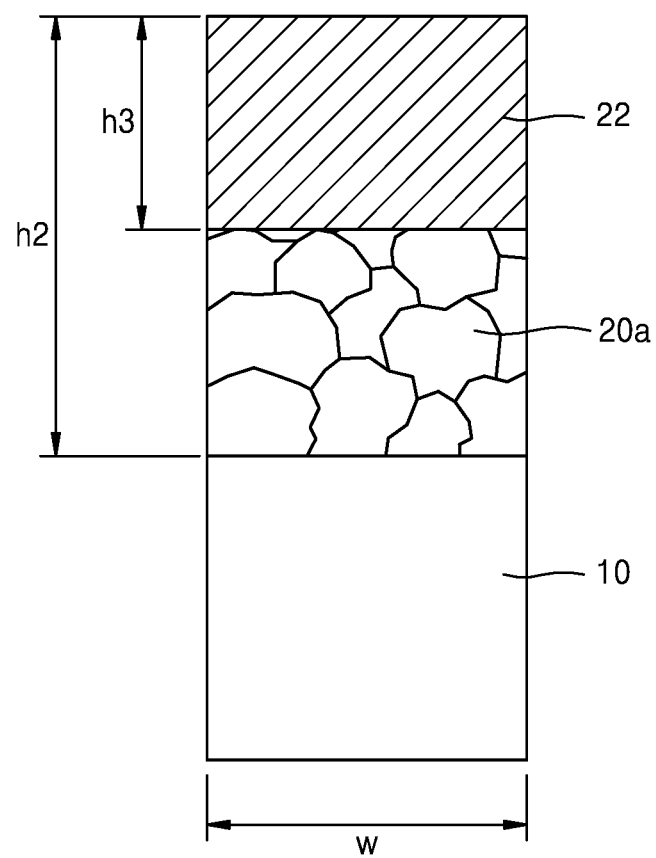
Figure 5C:
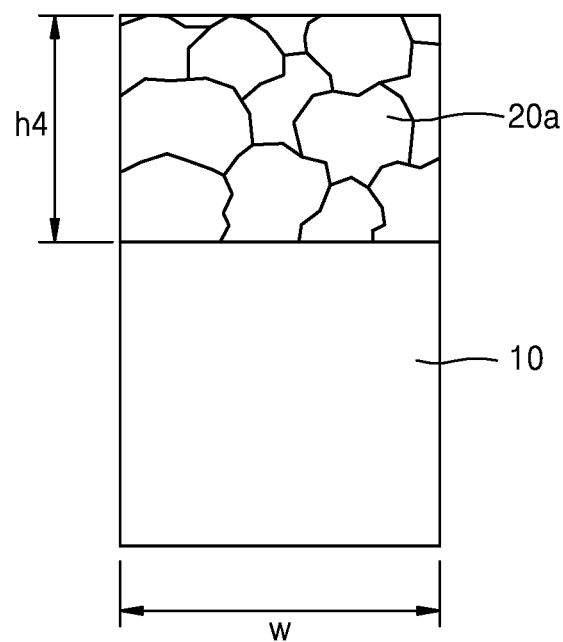

FIG. 4 is a flowchart of a method of processing a crystalline material layer, according to an example embodiment. FIGS. 5A to 5C are schematic diagrams showing changes in a crystalline material layer when the crystalline material layer is treated with a single peak, according to an example embodiment.

Referring to FIGS. 4 and 5A, the substrate S including a polycrystalline material layer may be placed on a susceptor (corresponding to the second electrode E2 in FIG. 1A) (operation S110).

The substrate S may include a material layer 20 on an underlying material layer 10. The material layer 20 may be a polycrystalline material layer. The material layer 20 may include, for example, polysilicon, a metal, a conductive metal nitride, a metal silicide, a conductive metal oxide, or a combination thereof. In some embodiments, the material layer 20 may include at least one of TiN, MoN, NbN, CoN, TaN, TiAlN, TaAlN, W, Ti, Ta, Co, Ru, $RuO_2$, $SrRuO_3$, Ir, $IrO_2$, Pt, PtO, SRO ($SrRuO_3$), BSRO ($(Ba,Sr)RuO_3$), CRO ($CaRuO_3$), and LSCo ($(La,Sr)CoO_3$), or a combination thereof.

The material layer 20 may be formed to have a height h1 in a space having a width W. Here, a case where the material layer 20 is processed to have a height h4 (here, h1>h4) will be described.

Referring to FIGS. 4 and 5B, the material layer 20 having poly-crystallinity may be at least partially modified (operation S120). In FIG. 5B, it may be seen that an upper portion of the material layer 20 of FIG. 5A having poly-crystallinity is modified to an amorphous material layer 22. That is, a portion of the material layer 20 may be converted to the amorphous material layer 22 from a free surface, for example, an upper surface, of the material layer 20, to a certain depth.

A method of forming the amorphous material layer 22 by converting a portion of the material layer 20 having poly-crystallinity will be described below. That is, it has been found that, when plasma having the single peak ion energy distribution described above with reference to FIGS. 1 and 2A is applied to the material layer 20 by using the second plasma generator 140, at least a portion of the upper portion of the material layer 20 is changed to an amorphous state. That is, the second plasma generator 140 may generate the second plasma P2 having a single peak ion energy distribution capable of converting an upper portion of the material layer 20 into an amorphous state by appropriately combining a sinusoidal wave and a non-sinusoidal wave, and the material layer 20 may be brought into contact with the second plasma P2.

FIG. 5B is a schematic cross-sectional view of the material layer (20a, 22) after processing plasma having a single peak ion energy distribution. The amorphous material layer 22 may have a height h3, and a sum h2 of the height of the amorphous material layer 22 and the height of a remaining material layer 20a may be greater than the height h1 of the material layer 20 before being modified. However, the inventive concept is not limited thereto.

Referring to FIGS. 4 and 5C, the amorphous material layer 22 may be easily removed by using radicals (operation S130). Since the amorphous material layer 22 may be removed by using radicals only, a sinusoidal wave and a non-sinusoidal wave do not need to be supplied to the second plasma generator 140. Thus, in this case, supply of both a sinusoidal wave and a non-sinusoidal wave to the second plasma generator 140 may be blocked. However, when certain directionality is needed to remove the amorphous material layer 22, a bias may be applied to the second electrode E2 to provide anisotropy.

Figure 6:
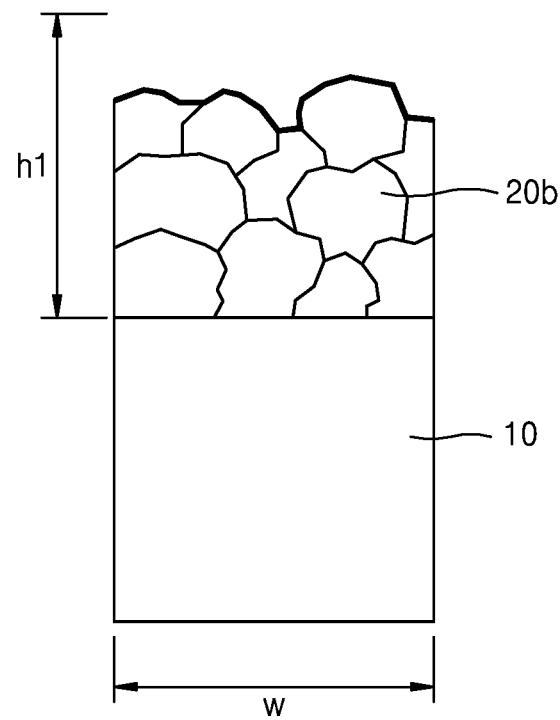
FIG. 6 is a schematic lateral diagram showing a surface of a material layer when the surface is removed by using radicals and/or ions without converting a portion of the material layer into an amorphous material layer as shown in FIGS. 5A to 5C.

FIG. 6 is a schematic lateral diagram showing a surface of remaining material layer 20b when a portion of material layer 20 is removed by using radicals and/or ions without converting a portion of the material layer 20 to the amorphous material layer 22 as shown in FIGS. 5A to 5C.

When the surface of the material layer 20 having a polycrystalline structure is directly removed by using radicals and/or ions, the surface of the material layer 20 is removed by units of crystal grains. In other words, for many of the crystal grains exposed to a processing environment using radicals and/or ions, certain crystal grains are preferentially removed as compared to other crystal grains, and thus a remaining material layer 20b having a rough surface is obtained. Here, the expression 'preferentially removed' may indicate that particular crystal grains are removed faster than the other crystal grains. Therefore, the expression 'preferentially removed' does not necessarily indicate that one crystal grain is completely removed before removal of another crystal grain begins.

The remaining material layer 20b having such a rough surface may be problematic, particularly in the case of a conductor with a small width W. When a current flows as a potential is applied to the remaining material layer 20b, an electric field may concentrate at an end of a rough surface thereof, and thus electrical characteristics may be unstable. Therefore, a semiconductor device having superior and more stable electrical characteristics may be obtained by fabricating the remaining material layer 20a to have a smooth and flat upper surface as shown in FIG. 5C.

Referring to FIGS. 1, 2A, 3, and 5B together, the ion energy distribution of a single peak required to modify the material layer 20, which is polycrystalline, into the amorphous material layer 22 may vary according to the type of the material layer 20. As described above, since the ion energy distribution of a single peak may be adjusted by controlling the height H of the rectangular waveform R of a non-sinusoidal wave and the slope m of the hypotenuse of the sawtooth waveform T of the non-sinusoidal wave, the height H and the slope m for modifying the material layer 20 into the amorphous material layer 22 may be found through trial and error.

Figure 1B:
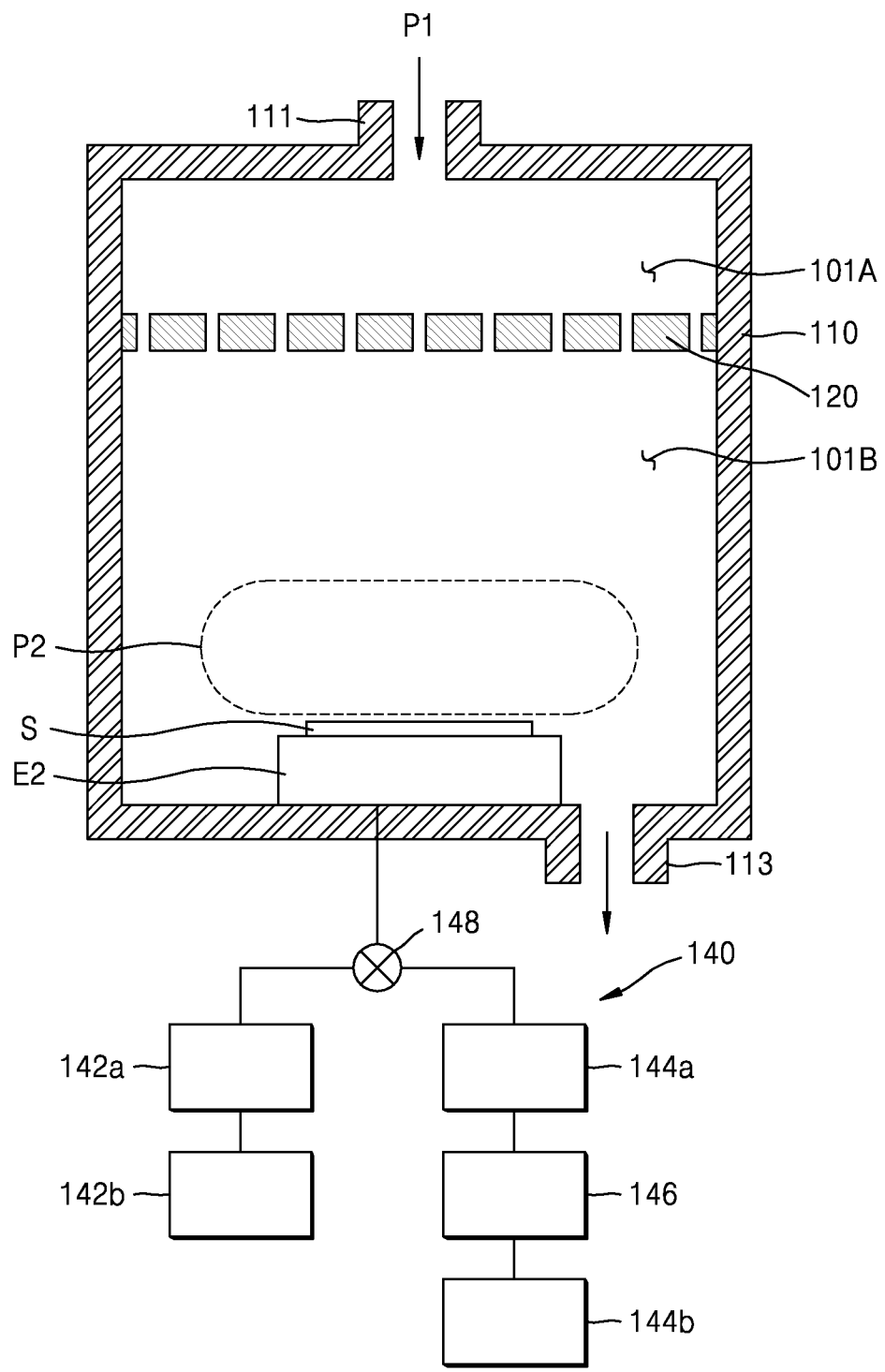

FIG. 1B is a schematic block diagram showing a substrate processing apparatus 100a according to another example embodiment.

The substrate processing apparatus 100a of FIG. 1B differs from the substrate processing apparatus 100 of FIG. 1A in that the first plasma generator 130 is omitted. Therefore, descriptions identical to those given above will be omitted below, and descriptions below will mainly focus on the difference.

Referring to FIG. 1B, in the substrate processing apparatus 100a, the first plasma P1, which is remotely generated, may be introduced directly into the first space 101A through the inlet 111. The first plasma P1 may be generated remotely by using a magnetron, a waveguide, or the like, and may be supplied to the inlet 111 through a gas supply pipe.

The first plasma P1 may flow into the first space 101A through the inlet 111 and may be supplied into the second space 101B through the shower head 120 as described above with reference to the substrate processing apparatus 100 of FIG. 1A. At this time, ions in the first plasma P1 may be blocked by the shower head 120 and only the radicals may pass through.

Figure 7:
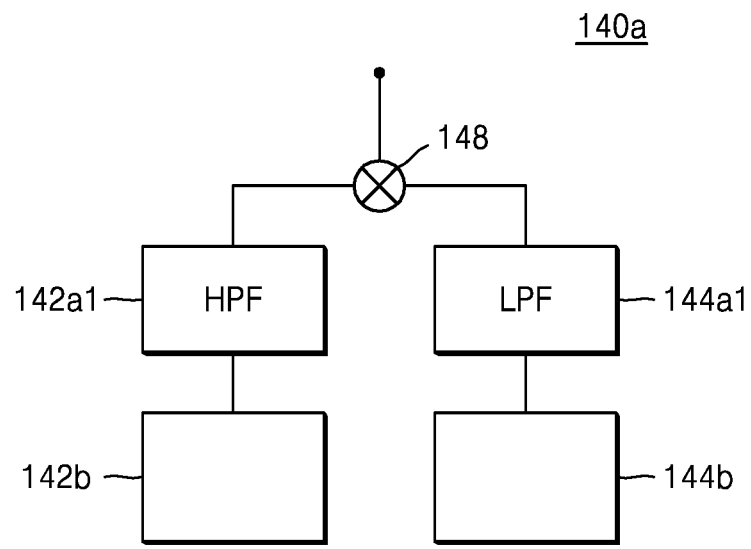
FIGS. 7 and 8 are schematic block diagrams showing second plasma generators according to example embodiments.

FIG. 7 is a block diagram showing a second plasma generator 140a according to an example embodiment.

Referring to FIG. 7, the second plasma generator 140a may include the sinusoidal wave generator 142b and the non-sinusoidal wave generator 144b.

The second plasma generator 140a may include a high pass filter (HPF) 142a1 to pass therethrough only a sinusoidal wave having a relatively high frequency from among sinusoidal waves generated by the sinusoidal wave generator 142b. For example, the HPF 142a1 may be a HPF having a frequency transfer characteristic for frequencies between 0.4 MHz and 2 MHz less than or equal to −15 dB and a frequency transfer characteristic for the frequency of 13.56 MHz equal to or greater than −1.5 dB.

The second plasma generator 140a may further include a low pass filter (LPF) 144a1 to pass therethrough only a non-sinusoidal wave having a relatively low frequency from among non-sinusoidal waves generated by the non-sinusoidal wave generator 144b. For example, the LPF 144a1 may be a LPF having a frequency transfer characteristic for frequencies between 0.4 MHz and 2 MHz equal to or greater than −1.5 dB and a frequency transfer characteristic for the frequency of 13.56 MHz less than or equal to −15 dB.

However, the frequency characteristics of the second plasma generator 140a according to example embodiments are not limited to the above values.

In some embodiments, the HPF 142a1 may be a HPF having a reactance equal to or higher than 3000 ohms for the frequency of 0.4 MHz, a reactance equal to or higher than 700 ohms for the range of frequencies from about 0.8 MHz to about 2 MHz, and a reactance less than or equal to 10 ohms for the frequency of 13.56 MHz.

In some embodiments, the LPF 144a1 may be a LPF having a reactance of less than or equal to 10 ohms for the frequency of 0.4 MHz and a reactance equal to or higher than 1000 ohms for the frequency of 13.56 MHz.

However, the impedance characteristics of the second plasma generator 140a according to example embodiments are not limited to the above values.

A mixer 128 may be an active mixer or a manual mixer.

Figure 8:
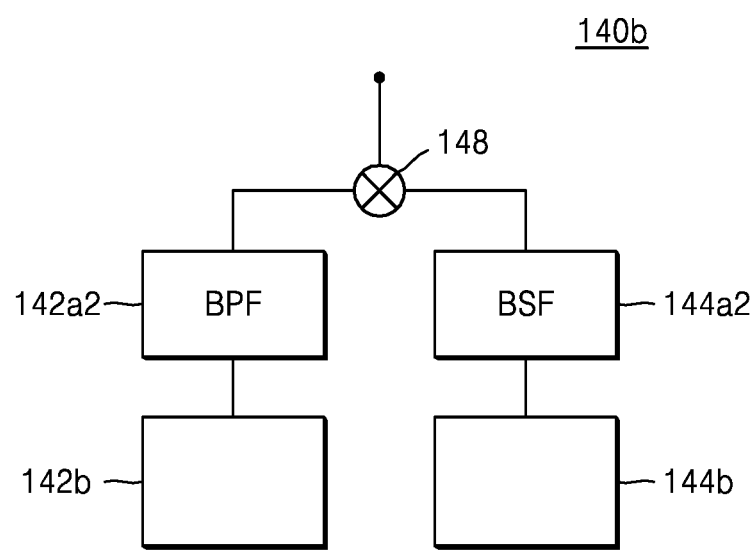

FIG. 8 is a block diagram showing a second plasma generator 140b according to an example embodiment.

Referring to FIG. 8, the second plasma generator 140b may include the sinusoidal wave generator 142b and the non-sinusoidal wave generator 144b.

The second plasma generator 140b may include a band pass filter (BPF) 142a2 to pass therethrough only a sinusoidal wave having a relatively high frequency from among sinusoidal waves generated by the sinusoidal wave generator 142b. For example, the BPF 142a2 may be a BPF having a frequency transfer characteristic for frequencies between 0.4 MHz and 2 MHz less than or equal to −15 dB and a frequency transfer characteristic for the frequency of 13.56 MHz equal to or greater than −1.5 dB.

The second plasma generator 140b may include a band stop filter (BSF) 144a2 to block only a non-sinusoidal wave having a relatively high frequency from among non-sinusoidal waves generated by the non-sinusoidal wave generator 144b. For example, the BSF 144a2 may be a BSF having a frequency transfer characteristic for frequencies between 0.4 MHz and 2 MHz equal to or greater than −15 dB and a frequency transfer characteristic for the frequency of 13.56 MHz less than or equal to −1.5 dB.

However, the frequency characteristics of the second plasma generator 140b according to example embodiments are not limited to the above values.

In some embodiments, the BPF 142a2 may be a BPF having a reactance equal to or higher than 3000 ohms for the frequency of 0.4 MHz, a reactance equal to or higher than 700 ohms for the range of frequencies from about 0.8 MHz to about 2 MHz, and a reactance less than or equal to 10 ohms for the frequency of 13.56 MHz.

In some embodiments, the BSF 144a2 may be a BSF having a reactance of less than or equal to 10 ohms for the frequency of 0.4 MHz and a reactance equal to or higher than 1000 ohms for the frequency of 13.56 MHz.

However, the impedance characteristics of the second plasma generator 140b according to example embodiments are not limited to the above values.

By using a substrate processing apparatus, a signal source device, and a method of processing a material layer according to the inventive concept, a smooth etched surface may be obtained for a crystalline material layer without a risk of device damage through RDC. Also, by using a method of fabricating a semiconductor device according to the inventive concept, a semiconductor device having a flatter upper surface of a material layer may be fabricated, thereby obtaining a semiconductor device having superior and more stable electrical characteristics.

Hereinafter, a semiconductor device including a stacked structure in which material layers as described above are stacked will be described.

Figure 9A:
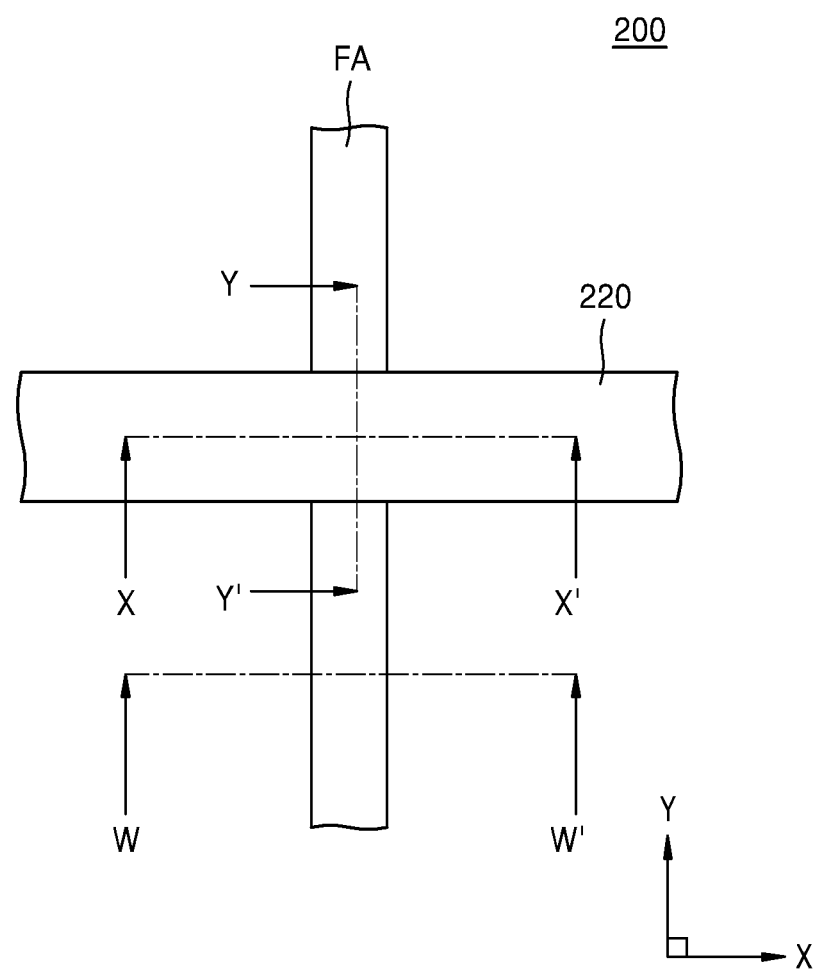
Figure 9B:
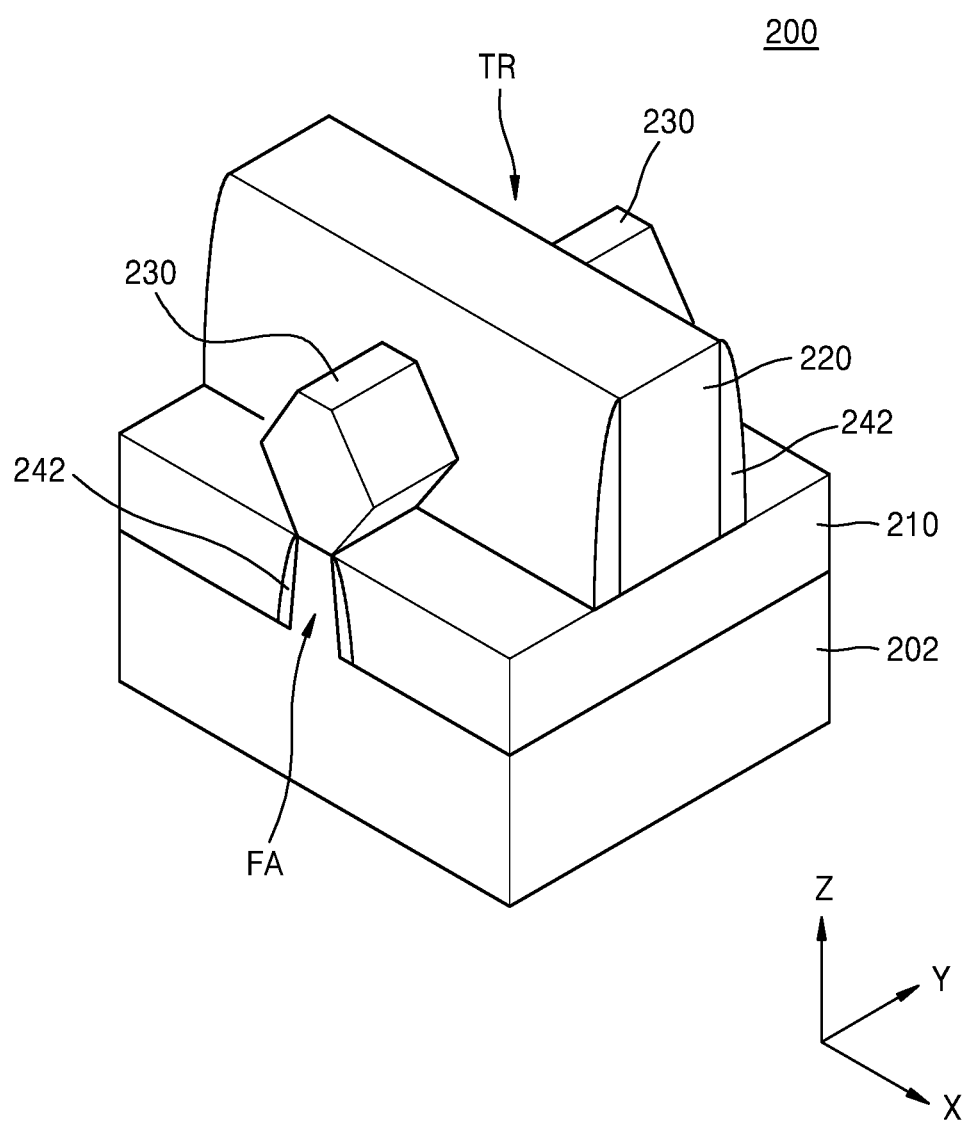
Figure 9C:
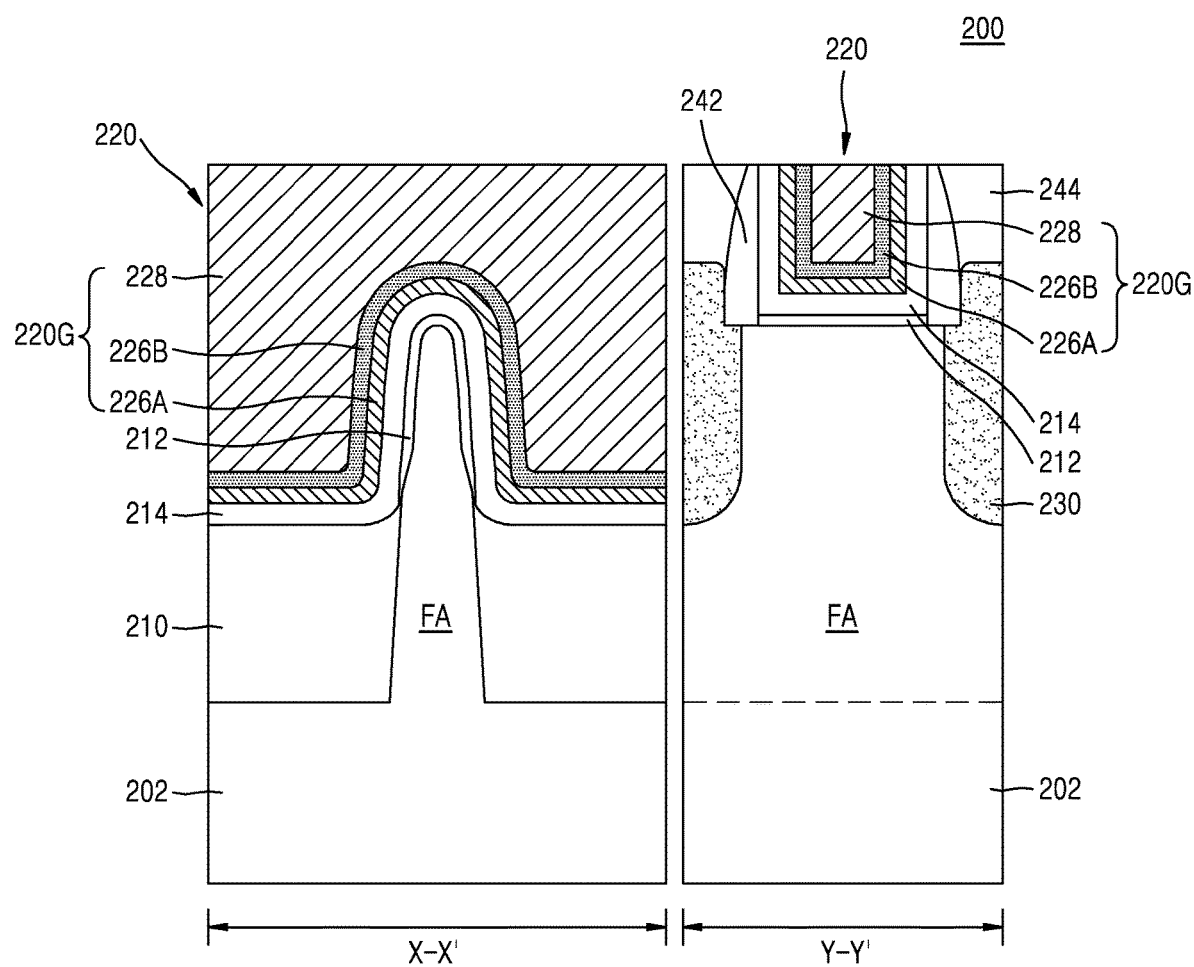

FIGS. 9A to 9C are diagrams showing a semiconductor device 200 provided on a semiconductor substrate. FIG. 9A is a plan view of the semiconductor device 200, FIG. 9B is a perspective view of the semiconductor device 200, and FIG. 9C is a cross-sectional view of the semiconductor device 200.

Referring to FIGS. 9A through 9C, the semiconductor device 200 includes a fin-type active region FA protruding from a substrate 202.

The substrate 202 may include at least one of a Group III-V material and a Group IV material. The Group III-V material may be a binary, ternary, or quaternary compound including at least one Group III element and at least one Group V element. The Group III-V material may be a compound including at least one element of In, Ga, and Al as the Group III element and at least one element of As, P, and Sb as the Group V element. For example, the Group III-V material may be selected from among InP, $In_zGa_{1-z}As$ (0≤Z≤1), and $Al_zGa_{1-z}As$ (0≤Z≤1). The binary compound may be any one of InP, GaAs, InAs, InSb, and or GaSb, for example. The ternary compound may be any one of InGaP, InGaAs, AlInAs, InGaSb, GaAsSb, and GaAsP. The Group IV material may be Si and/or Ge. However, the Group III-V materials and the Group IV materials that may be used for forming a thin film according to the inventive concept are not limited to the above examples.

The Group III-V material and the Group IV material like Ge may be used as a channel material capable of forming a low-power and high-speed transistor. A semiconductor substrate including a Group III-V material having a higher electron mobility than a Si substrate, e.g., a semiconductor substrate including GaAs, and a semiconductor material having a higher hole mobility than a Si substrate, e.g., a SiGe semiconductor substrate including Ge, may be used to form a high-performance CMOS. In some embodiments, when it is intended to form an N-type channel in the semiconductor substrate 202, the semiconductor substrate 202 may include any one of the above-stated Group III-V materials or SiC. In some other embodiments, when it is intended to form a P-type channel in the semiconductor substrate 202, the semiconductor substrate 202 may include SiGe.

The fin-type active region FA may extend in one direction (Y direction in FIGS. 9A and 9B). A device isolation film 210 covering the lower sidewall of the fin-type active region FA is formed on the substrate 202. The fin-type active region FA protrudes in a fin-like shape over the device isolation film 210. In some embodiments, the device isolation film 210 may include a silicon oxide film, a silicon nitride film, a silicon oxynitride film, or a combination thereof, but is not limited thereto.

Above the device isolation film 210, a gate structure 220 may extend over the fin-type active region FA in a direction (X direction) intersecting the direction in which the fin-type active region FA extends. Source/drain regions 230 may be formed on both sides of the gate structure 220 over the fin-type active region FA.

The source/drain regions 230 may include a semiconductor layer epitaxially grown from the fin-type active region FA. The source/drain regions 230 may include an embedded SiGe structure including a plurality of epitaxially grown SiGe layers, an epitaxially grown Si layer, or an epitaxially grown SiC layer. FIG. 9B exemplifies a case where the pair of source/drain regions 230 have particular cross-sectional shapes. However, according to the inventive concept, the cross-sectional shapes of the source/drain regions 230 are not limited to those shown in FIG. 9B and may vary. For example, the source/drain regions 230 may have various cross-sectional shapes like a circular shape, an elliptical shape, and a polygonal shape.

A MOS transistor TR may be formed at a portion where the fin-type active region FA and the gate structure 220 intersect each other. The MOS transistor TR includes a MOS transistor having a 3-dimensional structure in which channels are formed on the upper surface and both side surfaces of the fin-type active region FA. The MOS transistor TR may constitute an NMOS transistor or a PMOS transistor.

As shown in FIG. 9C, the gate structure 220 may include an interface layer 212, a high-k film 214, a first metal-containing layer 226A, a second metal-containing layer 226B, and a gap-fill metal layer 228 that are formed from a surface of the fin-type active region FA in the order stated. The first metal-containing layer 226A, the second metal-containing layer 226B, and the gap-fill metal layer 228 of the gate structure 220 may constitute a gate electrode 220G.

On both sides of the gate structure 220, insulation spacers 242 may be provided. Also, the insulation spacers 242 may be provided as source/drain spacers on sidewalls of an active region on both sides of the gate structure 220.

The insulation spacer 242 may include a low-k material layer as described above. Particularly, the insulation spacer 242 may be a SiOCN material layer. In some embodiments, the insulation spacer 242 may include a single layer. In some embodiments, the insulation spacer 242 may include multiple layers where two or more material layers are stacked.

An interlayer insulation film 244 covering the insulation spacer 242 on the opposite side of the gate structure 220 around the insulation spacer 242 may be formed.

The interface layer 212 may be formed on a surface of the fin-type active region FA. The interface layer 212 may include an insulating material layer like an oxide film, a nitride film, or a nitride oxide film. The interface layer 212 may constitute a gate insulating film together with the high-k film 214.

The high-k film 214 may include a material having a dielectric constant that is greater than that of a silicon oxide film. For example, the high-k film 214 may have a dielectric constant from about 10 to about 25. The high-k film 214 may include a material selected from among zirconium oxide, zirconium silicon oxide, hafnium oxide, hafnium oxynitride, hafnium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. However, the materials constituting the high-k film 214 are not limited to the above-stated examples.

In some embodiments, the first metal-containing layer 226A may include a nitride of Ti, a nitride of Ta, an oxynitride of Ti, or an oxynitride of Ta. For example, the first metal-containing layer 226A may include TiN, TaN, TiAlN, TaAlN, TiSiN, or a combination thereof. The first metal-containing layer 226A may be formed by using various deposition methods like ALD, CVD, and PVD.

In some embodiments, the second metal-containing layer 226B may include an N-type metal-containing layer needed for an NMOS transistor including an Al compound that contains Ti or Ta. For example, the second metal-containing layer 226B may include TiAlC, TiAlN, TiAlCN, TiAl, TaAlC, TaAlN, TaAlCN, TaAl, or a combination thereof.

In some other embodiments, the second metal-containing layer 226B may include a P-type metal-containing layer that is needed for a PMOS transistor. For example, the second metal-containing layer 226B may include at least one of Mo, Pd, Ru, Pt, TiN, WN, TaN, Ir, TaC, RuN, and MoN.

The second metal-containing layer 226B may include a single layer or multiple layers.

The second metal-containing layer 226B may control the work function of the gate structure 220 together with the first metal-containing layer 226A. The threshold voltage of the gate structure 220 may be adjusted by the work function control of the first metal-containing layer 226A and the second metal-containing layer 226B. In some embodiments, either the first metal-containing layer 226A or the second metal-containing layer 226B may be omitted.

The gap-fill metal layer 228 may be formed to fill the remaining gate space on the second metal-containing layer 226B when the gate structure 220 is formed through a replacement metal gate (RMG) process.

The gap-fill metal layer 228 is selected from a group consisting of metal nitrides like WN, TiN, and TaN, W, Co, Al, metal carbides, metal silicides, metal aluminum carbides, metal aluminum nitrides, metal silicon nitrides, etc.

The gap-fill metal layer 228 may have a polycrystalline structure. In this case, the roughness of the upper surface of the gap-fill metal layer 228 may be less than ½ of the average diameter of crystal grains of the gap-fill metal layer 228.

Although an integrated circuit device including a FinFET including a channel of a 3-dimensional structure has been described above with reference to FIGS. 9A to 9C, the inventive concept is not limited to the above description. For example, one of ordinary skill in the art will understand that, through various modifications and alterations within the scope of the inventive concept as described above, methods of fabricating integrated circuit devices including planar MOSFETs having characteristics according to the inventive concept may be provided.

FIGS. 10A to 10G are cross-sectional view diagrams sequentially showing a method of fabricating a semiconductor device according to an example embodiment. In FIGS. 10A to 10G, the Y-Y' cross-section and the W-W' cross-section represent the Y-Y' cross-section and the W-W' cross-section of FIG. 9A, respectively.

Figure 10A:
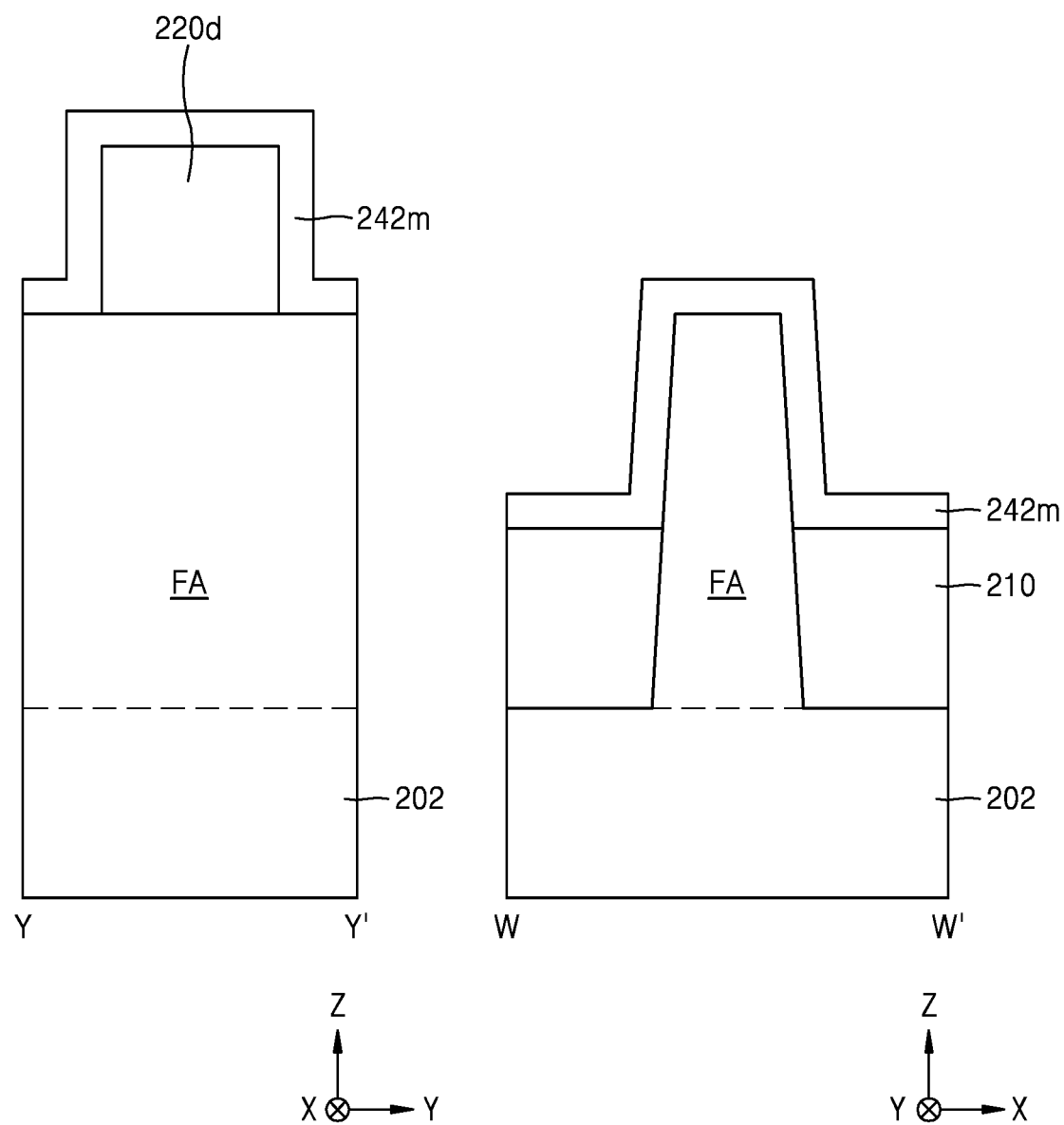
FIGS. 10A to 10G are cross-sectional view diagrams sequentially showing a method of fabricating a semiconductor device, according to an example embodiment.

Referring to FIG. 10A, a dummy gate electrode 220d may be formed on the substrate 202 on which the fin-shaped active region FA is defined by the device isolation layer 210. Next, a spacer material layer 242m may be conformally deposited over the substrate 202 and the dummy gate electrode 220d.

Since the substrate 202 has been described above with reference to FIG. 9A, further description thereof is omitted here.

The dummy gate electrode 220d may include, for example, polysilicon, but is not limited thereto. The dummy gate electrode 220d may be provided to secure a position and a space for forming a gate electrode later.

The spacer material layer 242m may include the low-k material layer described above. In some embodiments, the spacer material layer 242m may include a SiOCN material layer. In some embodiments, the spacer material layer 242m may include a single material layer of SiOCN. In some embodiments, the spacer material layer 242m may include a multi-material layer in which two or more material layers including SiOCN are stacked.

Figure 10B:
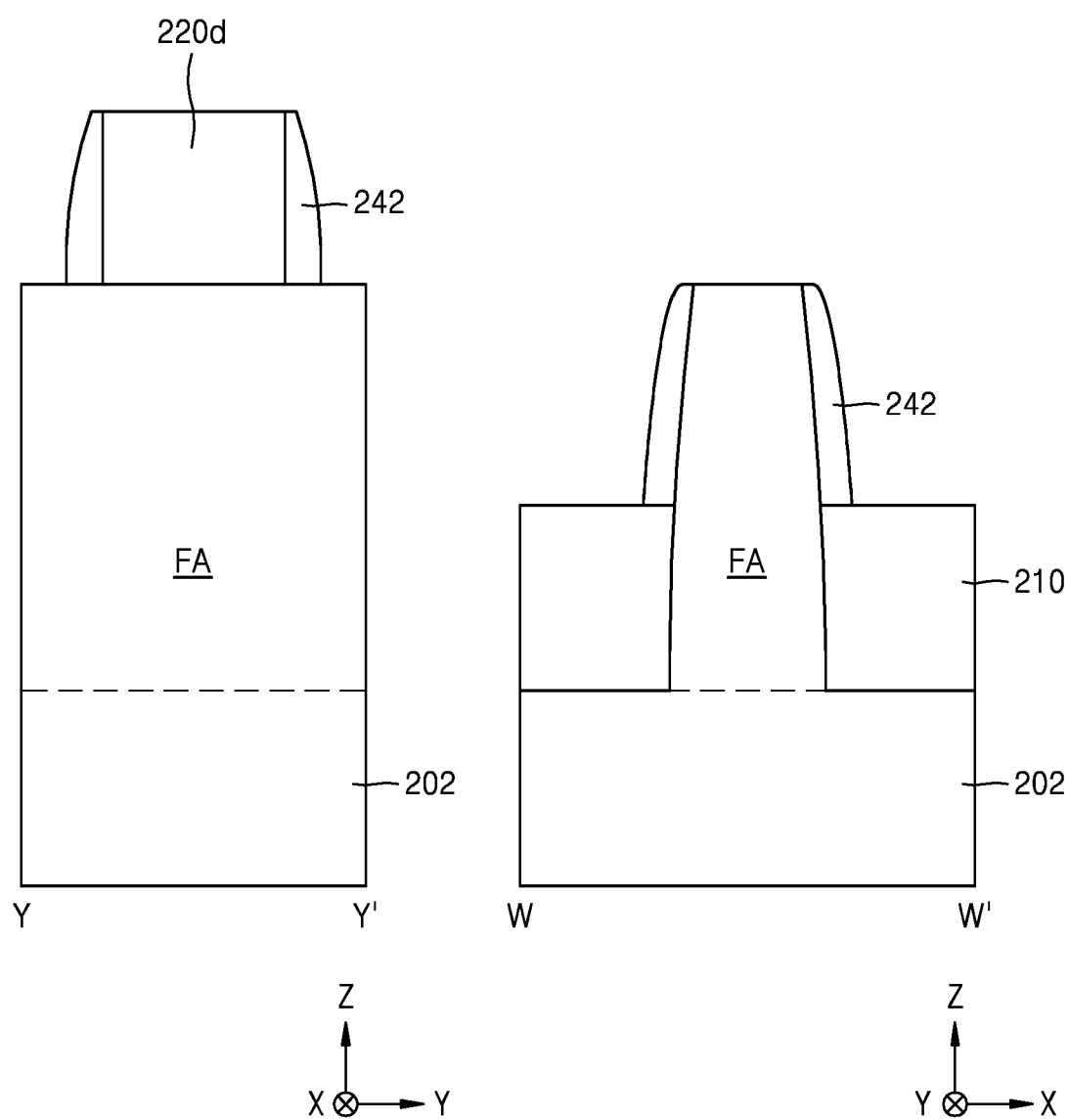

Referring to FIG. 10B, the spacers 242 are formed by anisotropically etching the spacer material layer 242m. The spacers 242 may be formed on the sidewalls of the dummy gate electrode 220d. Also, the spacers 242 may be formed on the sidewalls of the fin-type active region FA on both sides of the dummy gate electrode 220d.

Figure 10C:
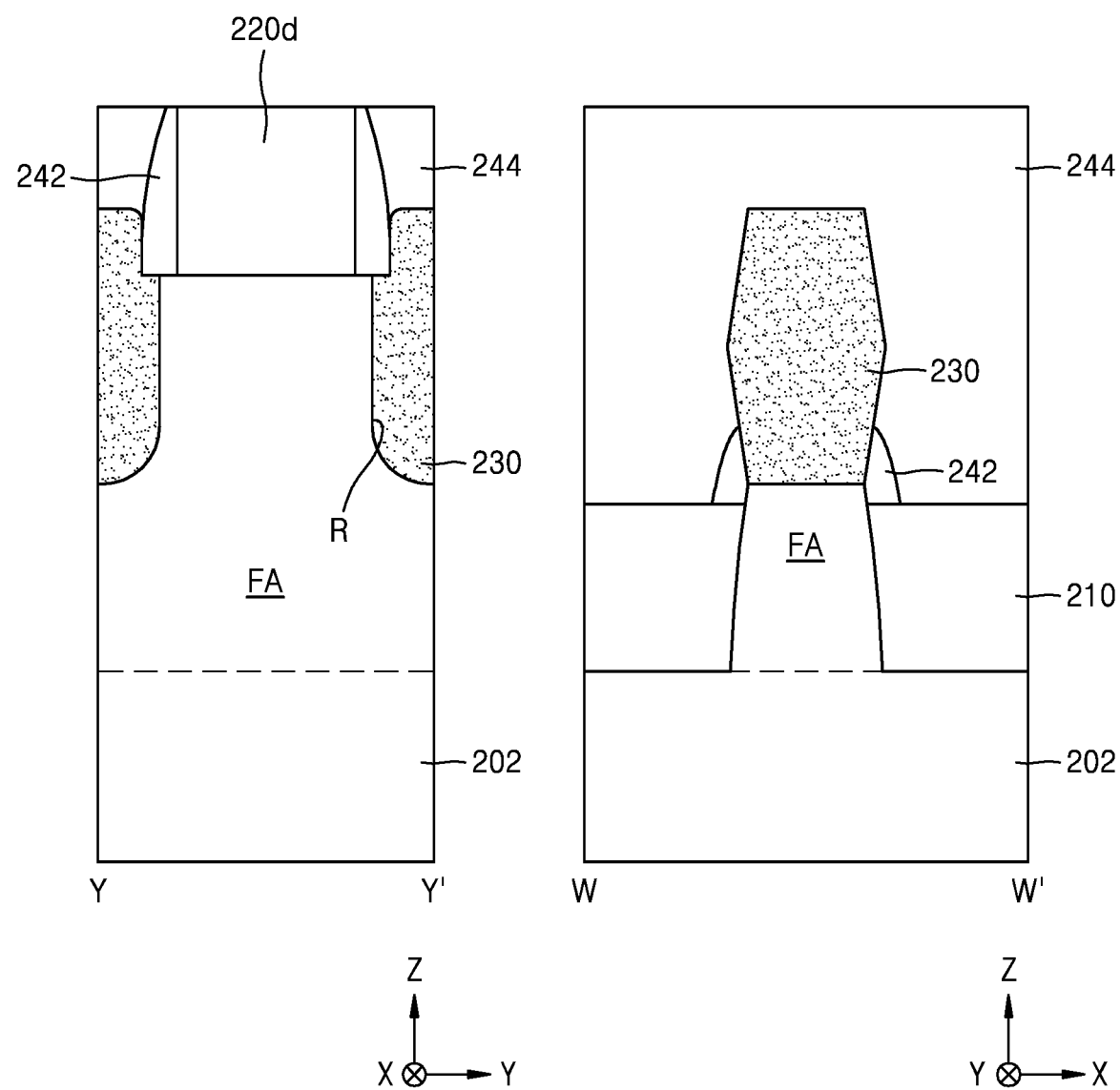

Referring to FIG. 10C, the fin-type active region FA may be partially removed by using the dummy gate electrode 220d and the spacers 242 as an etching mask.

Anisotropic etching and/or isotropic etching may be performed to partially remove the fin-type active region FA. Particularly, partial etching may be performed by combining anisotropic etching and isotropic etching to expose at least a portion of the bottom surface of the spacer 242 formed on the sidewall of the dummy gate electrode 220d.

More particularly, isotropic etching may be performed through wet etching after an exposed portion of the fin-type active region FA is anisotropically etched to a certain depth. As an etchant for the wet etching, for example, an $NH_4OH$ solution, trimethyl ammonium hydroxide (TMAH), an HF solution, an $NH_4F$ solution, or a mixture thereof may be used. However, the inventive concept is not limited thereto.

A recess is formed by anisotropic etching using the spacer 242 as an etching mask, and the wet etching is performed on the recess. As a result, a recess R that exposes a portion of the bottom surface of the spacer 242 as shown in FIG. 10C may be obtained. Particularly, the recess R may expose at least a portion of the bottom surface of the spacer 242 on the side of an impurity region.

In some embodiments, the wet etching performed to expose a portion of the bottom surface of the spacer 242 may be omitted.

Next, a source/drain material layer may be formed in the recess R on the side of the impurity region to form source/drain regions 230. The source/drain material layer may include Si, SiC, or SiGe, but the inventive concept is not limited thereto. The source/drain material layer may be formed, for example, by epitaxial growth. An impurity may be implanted in situ during epitaxial growth of the source/drain material layer or may be implanted through ion implantation after the source/drain material layer is formed. Furthermore, an upper surface of the source/drain regions 230 may be higher than the upper surface of the fin-type active region FA.

Next, the interlayer insulation film 244 may be formed on the source/drain regions 230. The interlayer insulation film 244 may include, for example, a silicon oxide, but is not limited thereto.

Figure 10D:
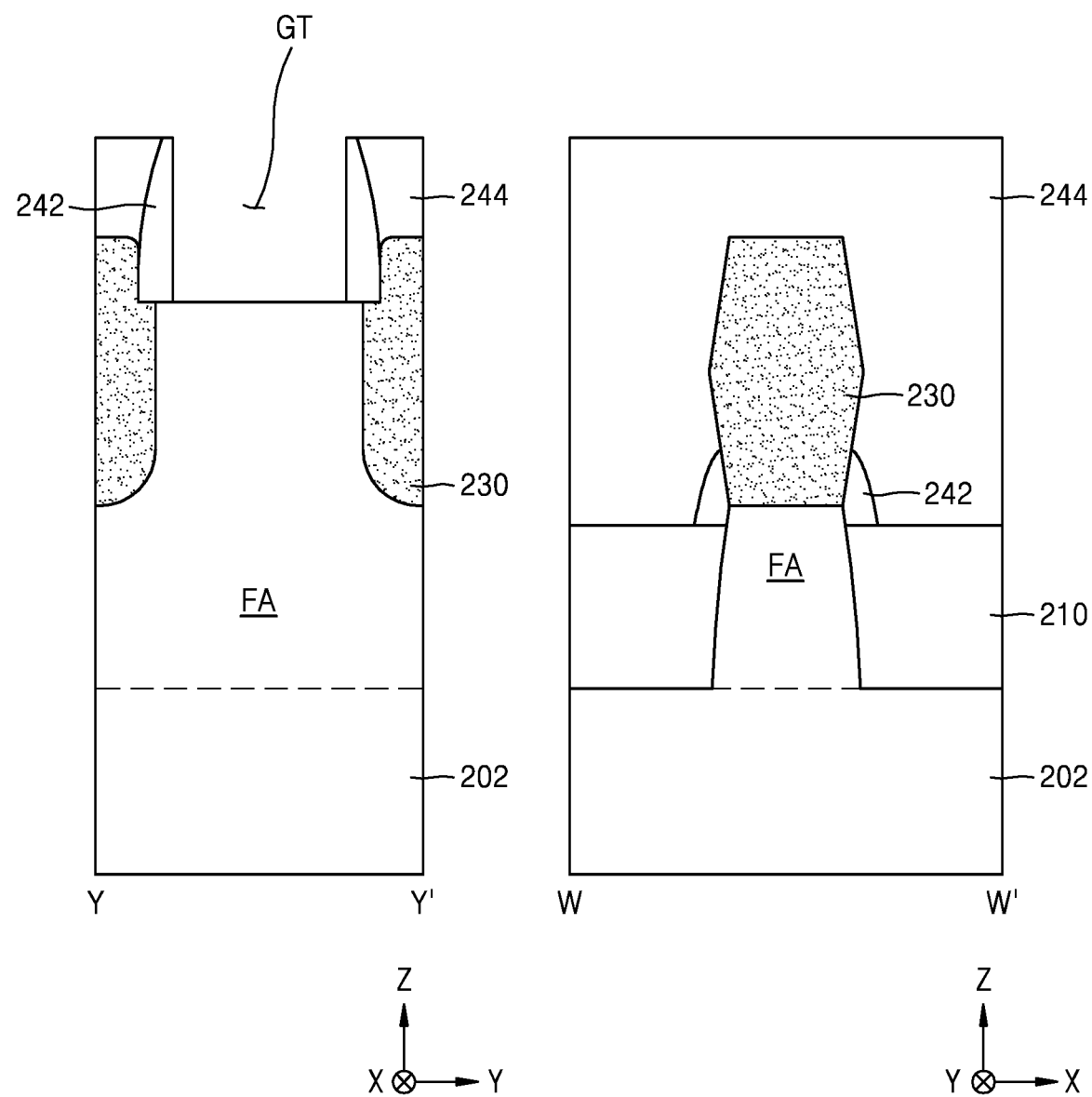

Referring to FIG. 10D, a gate trench GT may be formed by removing the dummy gate electrode 220d. A portion of an upper surface of the substrate 202 may be exposed by the gate trench GT. The portion of the semiconductor substrate 202 exposed by the gate trench GT may correspond to a channel region of a semiconductor device fabricated later.

The dummy gate electrode 220d may be removed through, for example, dry etching or wet etching.

Figure 10E:
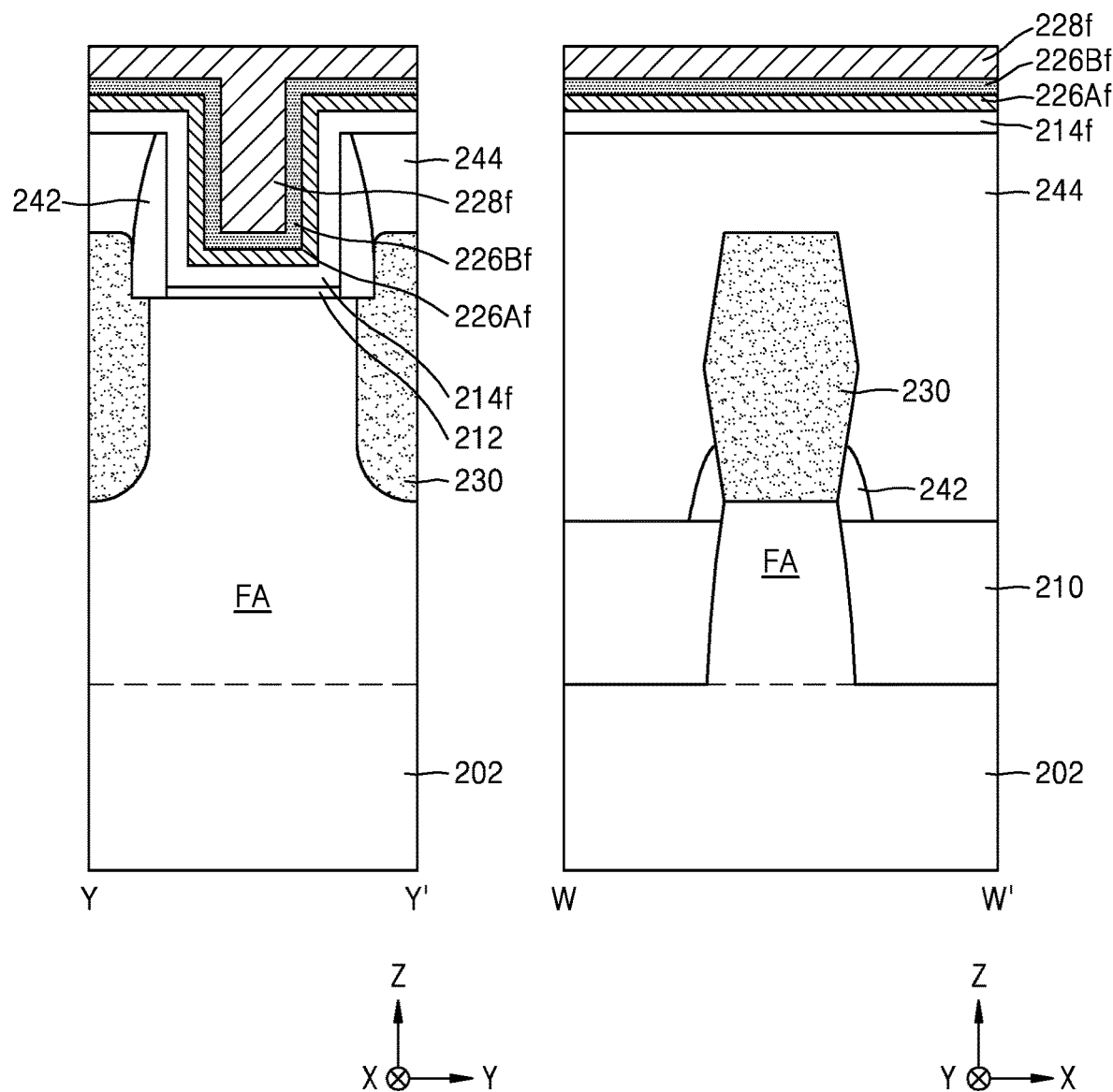

Referring to FIG. 10E, the interface layer 212 may be formed. Next, a high-k material layer 214f, a first metal-containing material layer 226Af, a second metal-containing material layer 226Bf, and a gap-fill metal material layer 228f are sequentially formed over the interface layer 212, the sidewalls of the gate trench GT, and the upper surface of the interlayer insulation film 244, respectively. Particularly, the high-k material layer 214f, the first metal-containing material layer 226Af, and the second metal-containing material layer 226Bf may be conformally formed along the respective surfaces. Furthermore, the gap-fill metal material layer 228f may be formed to fill a trench formed by the second metal-containing material layer 226Bf.

The high-k material layer 214f, the first metal-containing material layer 226Af, the second metal-containing material layer 226Bf, and the gap-fill metal material layer 228f may each be independently formed through an ALD process, a CVD process, or a PVD process. However, the inventive concept is not limited thereto.

Figure 10F:
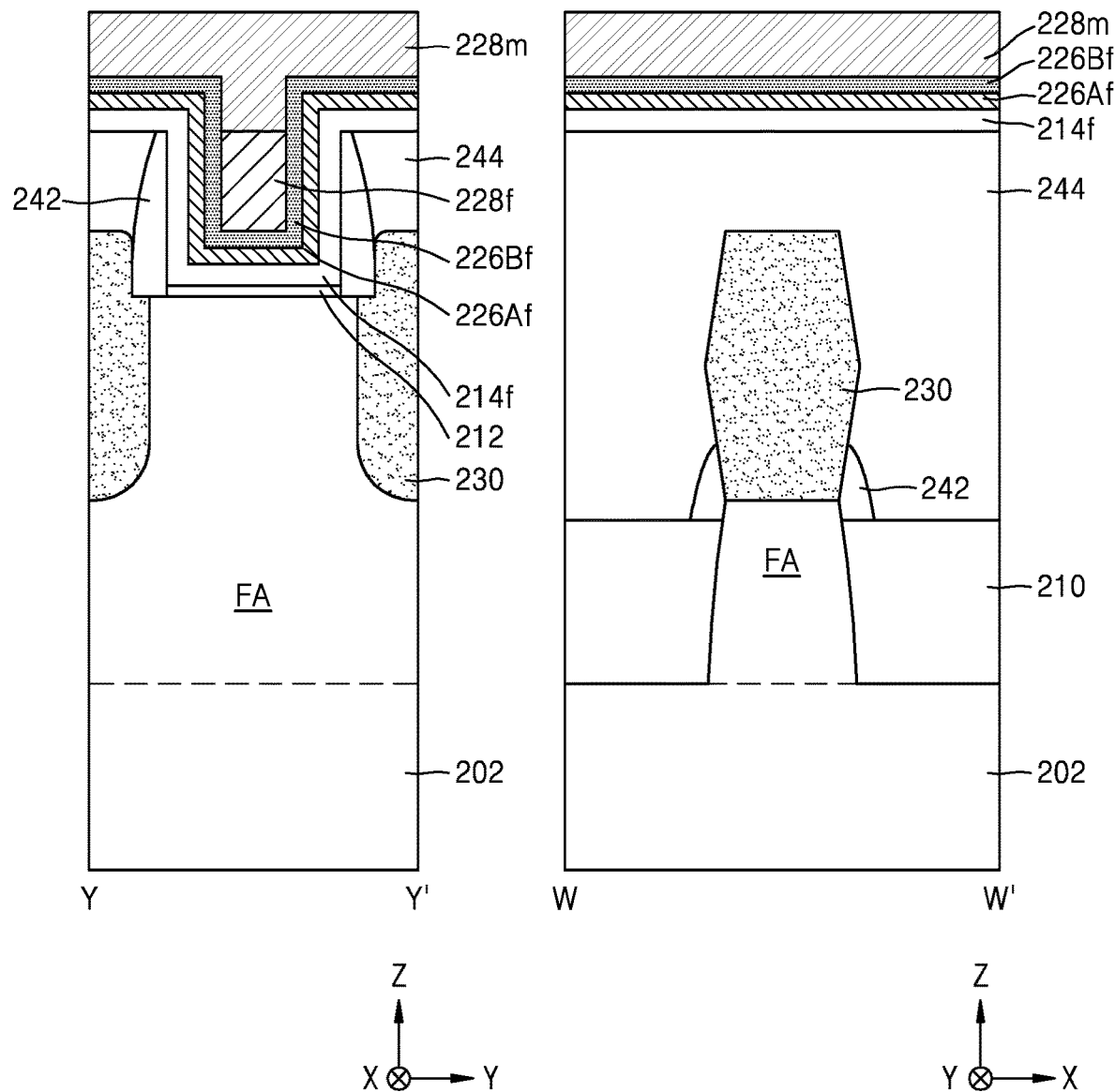

Referring to FIG. 10F, an amorphous material layer 228m may be formed by converting a portion of an upper surface side of the gap-fill metal material layer 228f into an amorphous state by using the substrate processing apparatus shown in FIG. 1. The method for converting an upper portion of the gap-fill metal material layer 228f, for example, a polycrystalline gap-fill metal material layer into an amorphous state from a free surface to a predetermined depth has been described above with reference to FIGS. 1, 2A, 3, and 5A to 5C, and thus detailed description thereof will be omitted below.

Figure 10G:
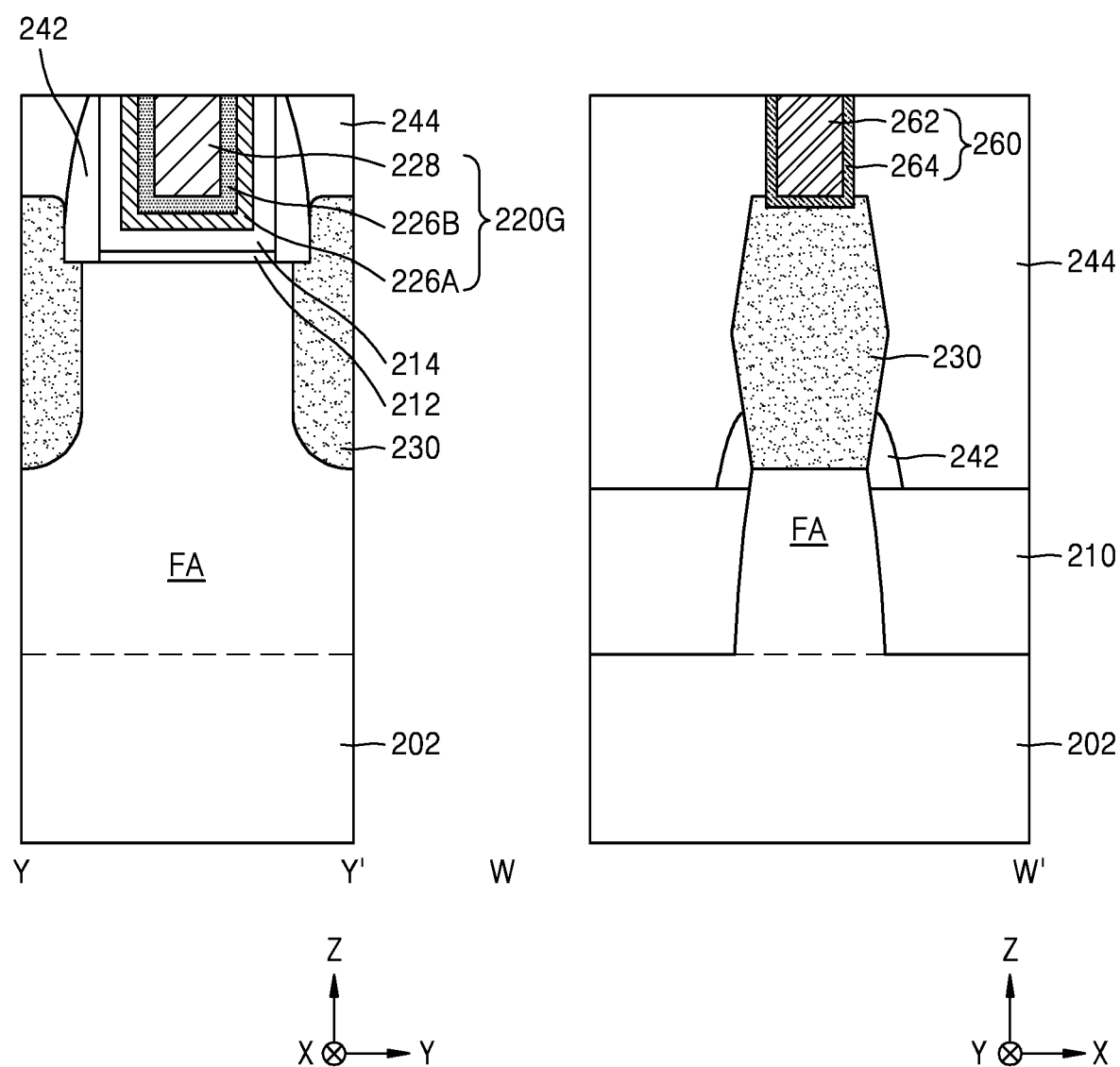

Referring to FIG. 10G, the semiconductor device 200 may be finally obtained by applying a planarizing process until the upper surface of the interlayer insulation film 244 is exposed. The planarization process may be performed through, for example, isotropic etching using radicals. As is known, by using RDC using radicals, dry etching may be performed as isotropic etching due to the radicals. However, the inventive concept is not limited thereto. As stated above, the RDC may be performed, for example, until the upper surface of the interlayer insulation film 244 is exposed. At this time, the amorphous material layer 228m may be removed through the RDC.

A contact 260 may be connected onto the impurity region constituting source/drain regions 230. The contact 260 may include a conductive barrier film 264 and a wire layer 262. In some embodiments, the conductive barrier film 264 may include titanium nitride, tantalum nitride, tungsten nitride, titanium carbon nitride, or a combination thereof, but is not limited thereto. In some embodiments, the wire layer 262 may include a doped semiconductor, a metal like Cu, Ti, W, or Al, a metal suicide like nickel suicide, cobalt suicide, tungsten suicide, tantalum suicide, or a combination thereof, but is not limited thereto. The gate electrode 220G and the contact 260 may be electrically insulated from each other by the interlayer insulation film 244.

Although FIGS. 9A to 9C and FIGS. 10A to 10G show that the source/drain regions 230 have a raised source/drain (RSD) structure, the inventive concept is not limited thereto. For example, the source/drain regions 230 may include impurity-doped regions formed in corresponding regions of the fin-type active region FA.

While the inventive concept has been particularly shown and described with reference to example embodiments thereof, it will be understood by one of ordinary skill in the art that various changes in form and details may be made therein without departing from the spirit and scope of the inventive concept as defined by the appended claims. Accordingly, future modifications of the embodiments of the inventive concept will not depart from the scope of the inventive concept.

What is claimed is:

1. A method of processing a material layer, the method comprising:
positioning a substrate comprising a polycrystalline material layer on a susceptor in a processing chamber;
converting an upper portion of the polycrystalline material layer into an amorphous material layer; and
removing the amorphous material layer by using radicals,
wherein the converting of the upper portion of the polycrystalline material layer into the amorphous material layer comprises:
supplying a sinusoidal wave signal and a non-sinusoidal wave signal to the susceptor to provide radicals and ions to the upper portion of the polycrystalline material layer.

2. The method of claim 1,
wherein ions generated by supplying the sinusoidal wave signal and the non-sinusoidal wave signal have a single peak ion energy distribution.

3. The method of claim 2,
wherein a position and a size of the single peak ion energy distribution are determined to modify at least a portion of the polycrystalline material layer into an amorphous material layer.

4. The method of claim 3,
wherein one period of the non-sinusoidal wave signal has a shape that is a combination of a rectangular waveform and a sawtooth waveform.

5. The method of claim 4,
wherein the position and size of the single peak ion energy distribution are changed by controlling a height of the rectangular waveform and a slope of a hypotenuse of the sawtooth waveform.

6. The method of claim 1,
wherein at least some of the radicals for removing the amorphous material layer are provided through the upper portion of the processing chamber.

7. The method of claim 1,
wherein neither the sinusoidal wave signal nor the non-sinusoidal wave signal is supplied to the susceptor during removal of the amorphous material layer.

8. A method of fabricating a semiconductor device, the method comprising:
forming a plurality of active regions on a substrate extending in a first direction and a device isolation film defining the active regions;
forming a dummy gate line extending in a second direction intersecting the active regions on the device isolation film;
forming source-drain regions in portions of the active regions exposed on both sides of the dummy gate line;
forming an insulating film covering the device isolation film and the source-drain regions around the dummy gate line;
removing the dummy gate line to form a gate trench extending between the source-drain regions;
forming a gate insulating film and a polycrystalline gate material layer in the gate trench;
converting an upper portion of the polycrystalline gate material layer into an amorphous material layer; and
removing the amorphous material layer by using radicals.

9. The method of claim 8,
wherein converting an upper portion of the polycrystalline gate material layer into the amorphous material layer comprises:
supplying a sinusoidal wave signal and a non-sinusoidal wave signal to a susceptor on which the substrate is disposed, to provide radicals and ions on a surface of the polycrystalline gate material layer.

10. The method of claim 8,
wherein a roughness of a surface of the polycrystalline gate material layer remaining after the amorphous material layer is removed is less than ½ of an average diameter of crystal grains of the polycrystalline gate material layer.

* * * * *